United States Patent [19]
Watanabe et al.

[11] Patent Number: 5,506,156
[45] Date of Patent: Apr. 9, 1996

[54] METHOD OF FABRICATING BIPOLAR TRANSISTOR HAVING HIGH SPEED AND MOS TRANSISTOR HAVING SMALL SIZE

[75] Inventors: Atsuo Watanabe, Hitachiota; Kazushige Sato; Takahiro Nagano, both of Hitachi; Shoji Shukuri, Koganei; Takashi Nishida, Tokyo, all of Japan

[73] Assignee: Hitachi, Ltd., Tokyo, Japan

[21] Appl. No.: 279,087

[22] Filed: Jul. 22, 1994

Related U.S. Application Data

[63] Continuation of Ser. No. 37,549, Mar. 26, 1993, abandoned, which is a continuation of Ser. No. 814,223, Dec. 23, 1991, abandoned, which is a continuation of Ser. No. 508,648, Apr. 10, 1990, abandoned.

[30] Foreign Application Priority Data

Apr. 12, 1989 [JP] Japan ................................. 1-090719

[51] Int. Cl.⁶ .................................................. H01L 21/265
[52] U.S. Cl. ................................ 437/31; 437/59; 437/74; 437/75; 437/153; 148/DIG. 9; 257/370; 257/378
[58] Field of Search ........................... 437/59, 74, 75, 437/153, 31; 148/DIG. 9; 257/370, 378

[56] References Cited

U.S. PATENT DOCUMENTS

| | | | |
|---|---|---|---|
| 4,950,616 | 8/1990 | Kahng et al. | 148/DIG. 9 |
| 5,268,309 | 12/1993 | Mizutani et al. | 437/153 |
| 5,340,751 | 8/1994 | Maeda et al. | 437/59 |

FOREIGN PATENT DOCUMENTS

| | | | |
|---|---|---|---|
| 0143453 | 6/1990 | Japan | 437/59 |

*Primary Examiner*—George Fourson
*Assistant Examiner*—Long Pham
*Attorney, Agent, or Firm*—Antonelli, Terry, Stout & Kraus

[57] ABSTRACT

A semiconductor device includes a plurality of semiconductor regions of a first conductive type and a plurality of semiconductor regions of a second conductive type. A MOS transistor having a channel of the second conductive type is formed in the semiconductor regions of the first conductive type, and a bipolar transistor and a MOS transistor having a channel of the first conductive type are formed in the semiconductor regions of the second conductive type. Each of the semiconductor regions of the first conductive type is made up of a semiconductor layer where the impurity concentration decreases with the depth from the surface thereof, a first buried layer of the first conductive type which is formed in a semiconductor substrate and where the impurity concentration distribution in the direction of thickness has a single peak value, and a second buried layer of the first conductive type which is formed between the semiconductor layer and the first buried layer and where the impurity concentration distribution in the direction of thickness has a single peak value. The first and second buried layers are formed by the ion implantation method, after an epitaxial growth process and a field oxidation process have been completed.

10 Claims, 4 Drawing Sheets

AT (A-A') CROSS SECTION ly-doped layer. Thus, the punch-through is generated,
METHOD OF FABRICATING BIPOLAR TRANSISTOR HAVING HIGH SPEED AND MOS TRANSISTOR HAVING SMALL SIZE This is a continuation of application Ser. No. 037,549 filed Mar. 26, 1993, now abandoned, which is a continuation of application Ser. No. 814,223, filed Dec. 23, 1991, now abandoned, which is a continuation of application Ser. No. 508,648, filed Apr. 10, 1990, now abandoned.

BACKGROUND OF THE INVENTION

The present invention relates to an integrated circuit device, and more particularly to a semiconductor device, in which a bipolar transistor having a high operation speed and a MOS transistor having a small size are formed on the same substrate so as to make an integrated circuit.

A conventional semiconductor device, in which a bipolar transistor and a MOS transistor are formed on the same substrate, is discussed on pages 1115 to 1123 of the IEICE (Institute of Electronics, Information and Communication Engineers of Japan) Technical Report C, Vol. J70-C, No. 8, August, 1987. A semiconductor device in which a bipolar transistor and a MOS transistor is disclosed also in U.S. patent application, Ser. No. 554,794, filed Nov. 23, 1983 now U.S. Pat. No. 5,208,589. FIG. 2A is a sectional view showing the above semiconductor device, and FIG. 2B shows the impurity concentration distribution at the cross section taken along the line A—A' of FIG. 2A. Referring to FIG. 2A, each of first semiconductor regions 2 and 5 includes a $P^+$-buried layer 20 and a P-diffusion layer 21. The P-diffusion layer 21 is produced by the diffusion of a P-type impurity from the surface of the layer 21. An N-channel MOS transistor 60 is formed in the first semiconductor region 2. Each of second semiconductor regions 3 and 4 includes an $N^+$-buried layer (that is, heavily-doped N-buried layer) 30 and an N-diffusion layer 31. An NPN bipolar transistor 70 and a P-channel MOS transistor 80 are formed in the second semiconductor regions 3 and 4, respectively. The P+-buried layer 20 and P-diffusion layer 21 of the first semiconductor region 5 are interposed between the second semiconductor regions 3 and 4 to electrically isolate these regions 3 and 4 from each other. The impurity concentration in the first semiconductor region 2 becomes minimum at a depth, as shown in FIG. 2B.

When a bipolar transistor having a high operation speed and a MOS transistor having a small size are formed on the same substrate in the above-mentioned manner, it is impossible to make the size of the MOS transistor smaller than a limit. The reason for this will be explained below. In the first semiconductor region 2 of FIG. 2A, as shown in FIG. 2B, a lightly-doped layer is formed at the connecting portion between the P-diffusion layer 21 which is formed by the diffusion of a P-type impurity from the surface of the first semiconductor region, and the $P^+$-buried layer 20. Accordingly, the depletion layer generated at each of the source and drain of the MOS transistor which is formed in the first semiconductor region, is enlarged at the above-mentioned, lightly-doped layer. Thus, the punch-through is generated, and a threshold voltage is lowered. That is, the short channel characteristics of the MOS transistor are deteriorated. Accordingly, it is difficult to form an integrated circuit by using a MOS transistor with a small gate length. This problem can be solved by increasing the impurity concentration of the $P^+$-buried layer 20 as indicated by a dashed curve in FIG. 2B, thereby enhancing the impurity concentration of lightly-doped layer. The method, however, has the following drawback, and cannot be used. As can be seen from FIG. 2A, a main function of the $P^+$-buried layer 20 is to electrically isolate two $N^+$-buried layers 30 from each other. In this point, an increase in the impurity concentration of the $P^+$-buried layer 20 will cause no trouble. While, the $N^+$-buried layer 30 acts as the collector layer of the bipolar transistor. In order to operate a circuit which includes the bipolar transistor, at high speed, it is necessary to make substrate capacitance $C_{TS}$ which is produced between the above collector layer and a P-substrate, as small as possible. The substrate capacitance $C_{TS}$ is usually divided into two components, that is, a bottom component which is produced between the bottom of the $N^{+-buried}$ layer 30 and the P-substrate 1, and a side component which is produced between the side face of the $N^+$-buried layer 30 and the $P^+$-buried layer 20. Owing to the difference in impurity concentration between the $P^+$-buried layer 20 and the P-substrate 1, the side component of the substrate capacitance $C_{TS}$ is far greater than the bottom component thereof. Accordingly, when the impurity concentration of the $P^+$-buried layer 20 is increased, the side component is increased, and the substrate capacitance $C_{TS}$ is also increased. Thus, the operation speed of the circuit including the bipolar transistor is greatly reduced.

Accordingly, in a case where an integrated circuit including a MOS transistor with a small channel length and a high-speed bipolar transistor with small substrate capacitance $C_{TS}$ is formed as shown in FIG. 2A, it is impossible to make the channel length of the MOS transistor less than a limit, and thus a MOS transistor having satisfactory performance cannot be formed.

SUMMARY OF THE INVENTION

It is an object of the present invention to provide a semiconductor device, in which an integrated circuit is formed of a bipolar transistor and a very fine MOS transistor without deteriorating the high-speed characteristic of the bipolar transistor.

In order to attain the above object, a semiconductor device according to the present invention includes a semiconductor substrate, a first semiconductor region of a first conductive type formed in and on the semiconductor substrate, and a second semiconductor region of a second conductive type formed in and on the semiconductor substrate in the form of discrete islands. The second semiconductor region is made up of a buried layer of the second conductive type which is formed in the semiconductor substrate and is heavily doped with an impurity of the second conductive type, and a diffusion layer which is formed by growing a semiconductor layer epitaxially on the buried layer of the second conductive type and by diffusing an impurity into the epitaxially-grown layer. A base layer and an emitter layer are piled on an island of the second semiconductor region, to form a bipolar transistor. Further, a source, a drain and a gate are provided in another island of the second semiconductor region to form a MOS transistor having the channel of the first conductive type. The first semiconductor region of the first conductive type is made up of a first buried layer of the first conductive type which is formed in the semiconductor substrate and where the impurity concentration distribution in the direction of thickness has a single peak value, a second buried layer of the first conductive type which is formed on the first buried layer and where the impurity concentration distribution in the direction of thickness has a single peak value, and a semiconductor layer where the impurity concentration decreases with the depth from the surface of the semiconductor layer. A source, a drain and a gate are provided in the first semiconductor region to form a MOS transistor having the channel of the second conductive type. Alternatively, the first semiconductor region is used for electrically isolating two islands of the second semiconductor region from each other.

A semiconductor device according to the present invention can be fabricated in such a manner that after an epitaxial growth process and a field oxidation process, ion implantation using high-energy ions is carried out to form the first and the second buried layers of the first conductive type.

Thus, the impurity concentration distribution in each of the first and the second buried layers can be set to a desired state through ion implantation techniques. That is, according to the present invention, the second buried layer for preventing the punch through of the MOS transistor having the channel of the second conductive type can be formed without increasing the impurity concentration of the first buried layer which is kept in contact with the heavily-doped buried layer of the second conductive type serving as the collector of the bipolar transistor.

That is, according to the present invention, an integrated circuit can be formed of a bipolar transistor and a MOS transistor having a channel length less than or equal to 0.5 μm, without deteriorating the high-speed characteristic of the bipolar transistor.

DESCRIPTION OF THE PREFERRED EMBODIMENTS

Figure 1A:
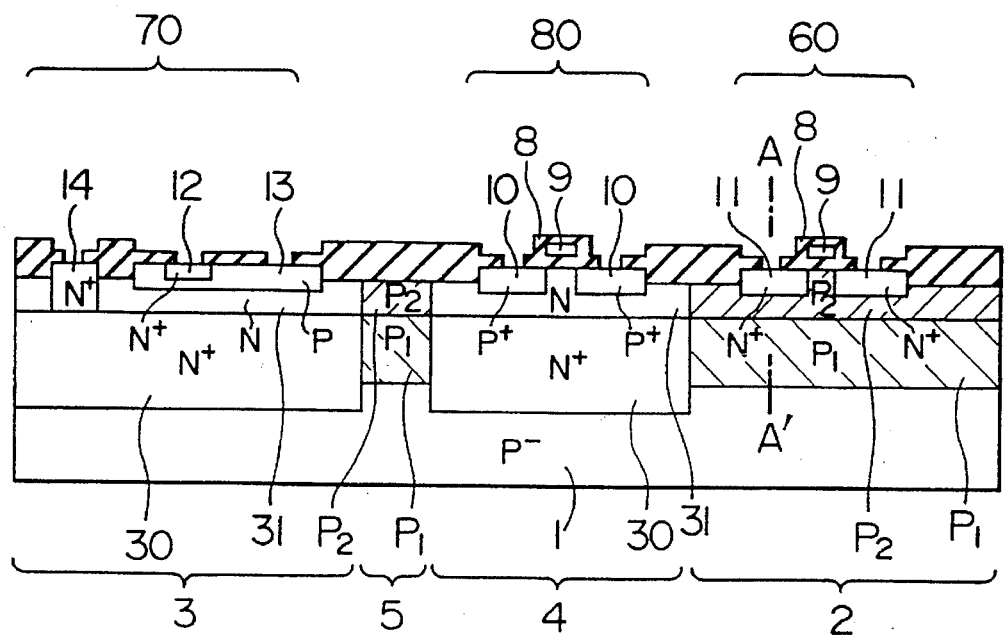
FIG. 1A is a sectional view showing an embodiment of a semiconductor device according to the present invention.
Figure 1B:
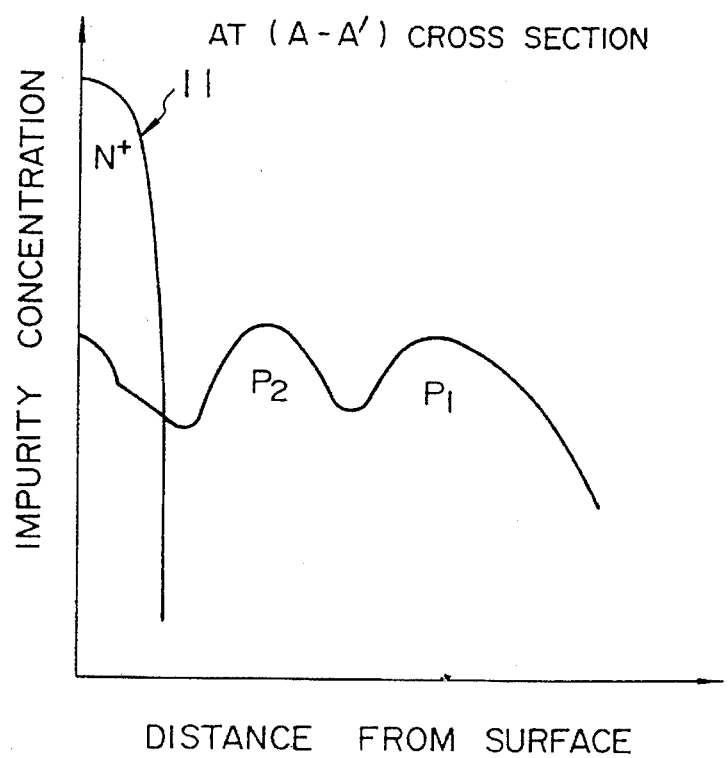
FIG. 1B is a graph showing the impurity concentration distribution along the line A—A' of FIG. 1A.
Figure 2A:
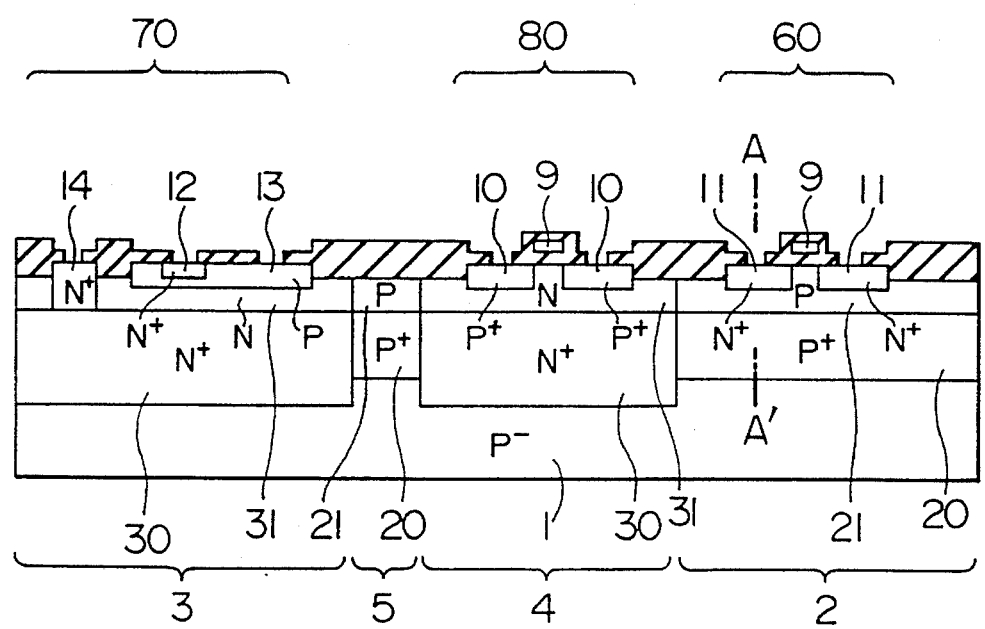
FIG. 2A is a sectional view showing a conventional semiconductor device.
Figure 2B:
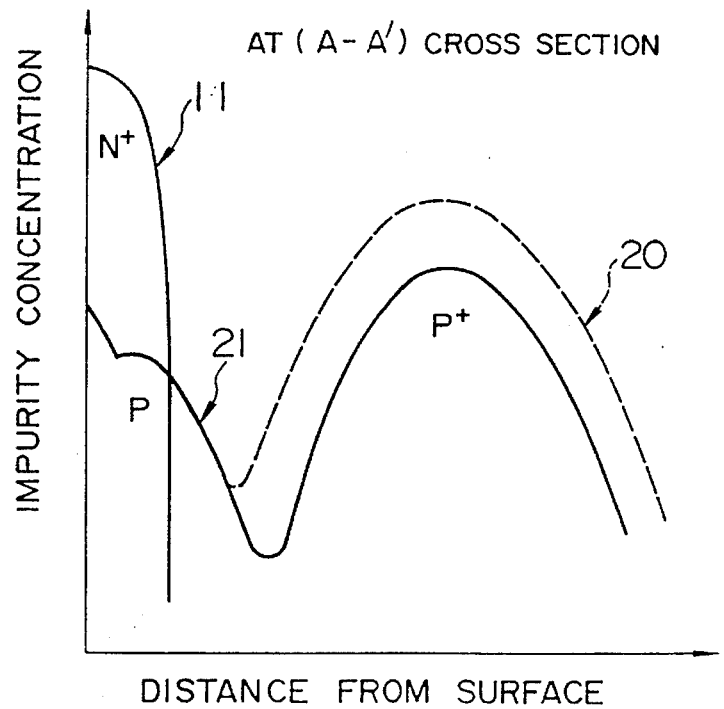
FIG. 2B is a graph showing the impurity concentration distribution along the line A—A' of FIG. 2A.

FIG. 1A is a sectional view showing an embodiment of a semiconductor device according to the present invention, and FIG. 1B shows the impurity concentration distribution along the line A—A' of FIG. 1A. Now, explanation will be made of a case where the first conductive type is the P-type, and thus an NPN transistor, an N-channel MOS transistor and a P-channel MOS transistor are formed on the same substrate.

A characteristic feature of the present invention resides in that the $P^+$-buried layer 20 of the conventional semiconductor device is divided into two P-buried layers $P_1$ and $P_2$ which are independent of each other. For example, in a case where the P-buried layers $P_1$ and $P_2$ are formed by the ion implantation method, each of the layers $P_1$ and $P_2$ has an impurity concentration of $5\times10^{16}$ to $5\times10^{17}$ cm$^{-3}$, and the minimum impurity concentration at the boundary between the layers $P_1$ and $P_2$ lies in a range from $1\times10^{15}$ to $5\times10^{16}$ cm$^{-3}$. Referring to FIG. 1B, although the distance of each of the buried layers $P_1$ and $P_2$ from a surface is dependent upon the thickness of a semiconductor layer formed on a semiconductor substrate, the distance of the layer $P_1$ from the surface usually lies in a range 0.5 to 1.7 μm, and the distance of the layer $P_2$ from the surface usually lies in a range from 0.1 to 0.6 μm. As mentioned above, the P-buried layers $P_1$ and $P_2$ are formed independently of each other. Accordingly, two $N^+$-buried layers 30 can be electrically isolated from each other in a favorable state by appropriately selecting the impurity concentration of the P-buried layer $P_1$, and the short channel characteristics of the N-channel MOS transistor can be controlled by varying the impurity concentration of the buried layer $P_2$. Thus, in a case where an integrated circuit is formed of a bipolar transistor and a MOS transistor having a small channel length, it is not required to increase the impurity concentration of the buried layer $P_1$. Accordingly, the side component of the substrate capacitance $C_{TS}$ is not increased, and thus the substrate capacitance $C_{TS}$ is kept at a small value. That is, the integrated circuit can be formed without deteriorating the high-speed characteristic of the bipolar transistor.

Now, explanation will be made of an embodiment of a method of fabricating an inventive semiconductor device.

FIGS. 3A to 3E show an example of the fabrication process of the semiconductor device of FIG. 1.

Figure 3A:
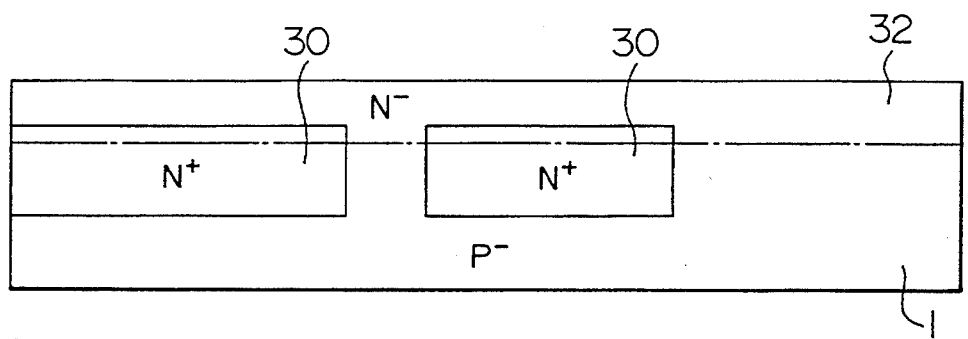
FIGS. 3A to 3E are sectional views for explaining an example of a method of fabricating the embodiment of FIG. 1A.

In the first step, as shown in FIG. 3A, antimony is diffused into predetermined portions of a P-silicon substrate 1 having a sheet resistivity of 10 Ω/□, to form the $N^+$-buried layer 30 in the form of discrete islands, and then an N-silicon layer 32 is epitaxially grown to a thickness of 0.5 to 1.0 μm.

Figure 3B:
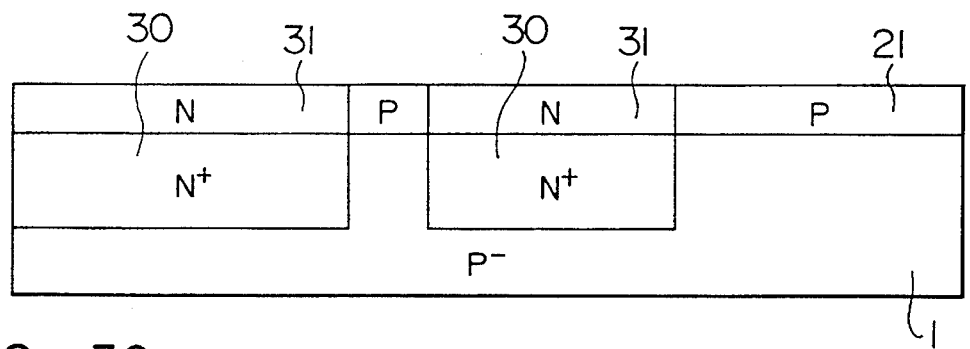

In the second step, phosphorus ions are implanted in those portions of the silicon layer 32 which exist on the islands of the $N^+$-buried layer 30, at an ion accelerating voltage of 125 KeV and at a dose of $1\times10^{12}$ to $5\times10^{12}$ cm$^{-2}$, with the aid of a mask formed of a silicon oxide film. Further, $BF_2$ ions are implanted in those portions of the silicon layer 32 which are not implanted with phosphorus, at an ion accelerating voltage of 60 KeV and at a dose of $1\times10^{12}$ to $5\times10^{12}$ cm$^{-2}$, with the aid of a mask formed of a silicon oxide film. Then, heat treatment is carried out at 1,000° C. Thus, an N-diffusion layer 31 and a P-diffusion layer 21 are formed as shown in FIG. 3B.

Figure 3C:
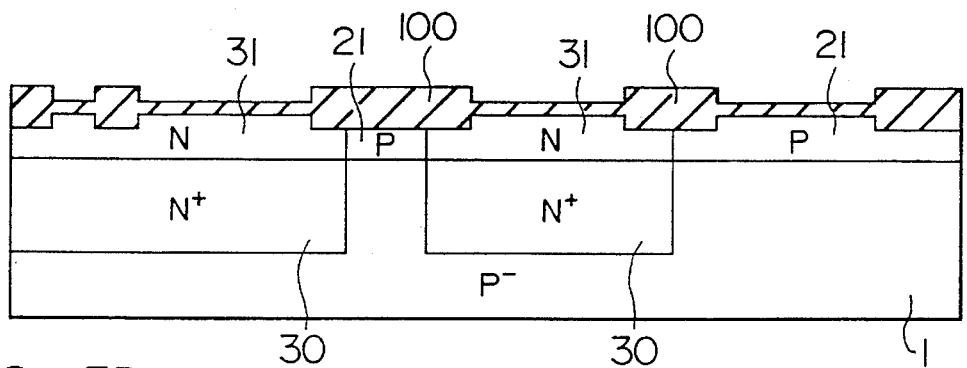

In the third step, a silicon oxide film and a silicon nitride film are patterned so that these films on areas where circuit elements such as a MOS transistor and a bipolar transistor are to be formed, are left unremoved, and then heat treatment is carried out in an oxidizing atmosphere to form a silicon oxide film 100 having a thickness of 4,000 to 6,000 Å by selective oxidation, as shown in FIG. 3C.

Figure 3D:
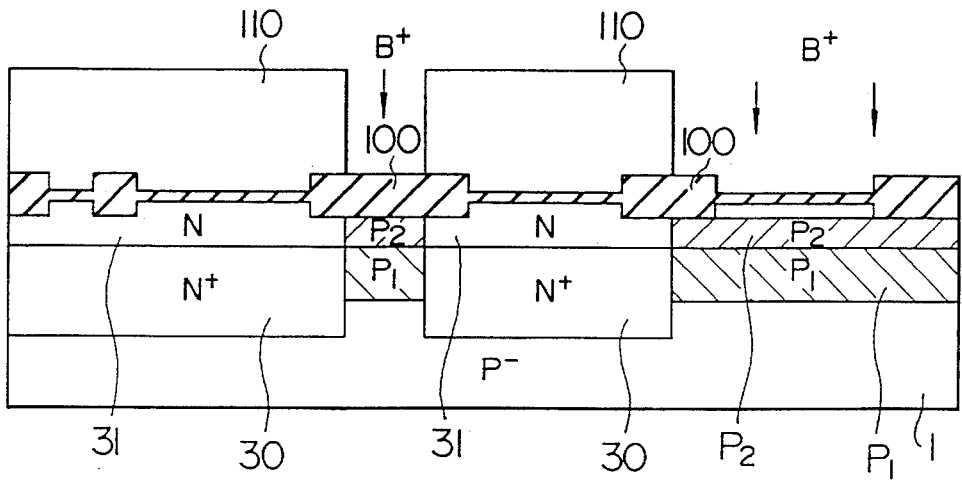

In the fourth step, boron ions are implanted in a lower portion of the P-diffusion layer 21 at an ion accelerating voltage of 40 to 250 KeV and at a dose of $2\times10^{12}$ to $1\times10^{13}$ cm$^{-2}$, with the aid of a photoresist film 110 serving as a mask, to form the P-buried layer $P_2$. Further, boron ions are implanted in the substrate 1 at an ion accelerating voltage of 200 to 1000 KeV and at a dose of $2\times10^{12}$ to $1\times10^{13}$ cm$^{-2}$, with the aid of the photoresist film 110, to form the P-buried layer $P_1$ as shown in FIG. 3D.

Figure 3E:
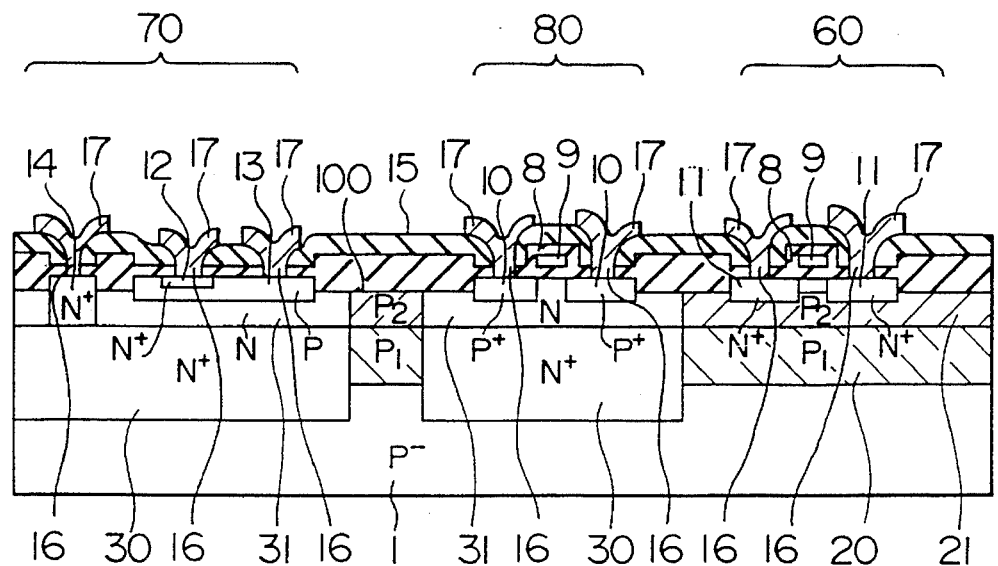

In the fifth step, a gate oxide film 8, a gate electrode 9, the source and drain regions 10 of the P-channel MOS transistor, the source and drain regions 11 of the N-channel MOS transistor, an emitter 12, a base 13, a collector 14, an insulating film 15, a contact hole 16, and a wiring electrode 17 are formed as shown in FIG. 3E. These members 8 to 17 are formed by a conventional method of fabricating an ordinary MOS transistor and an ordinary bipolar transistor.

In the present embodiment shown in FIG. 1A, the P-buried layers $P_1$ and $P_2$ are formed through ion implantation techniques after the field oxide film has been formed. Accordingly, the buried layers $P_1$ and $P_2$ will never disappear in the field oxide film. Moreover, the heat treatment after the formation of the field oxide film is carried out at a relatively low temperature. Accordingly, the boron concentration distribution in the buried layers $P_1$ and $P_2$ are scarcely affected by the heat treatment, and thus it is easy to optimize the structure of each of the buried layers $P_1$ and $P_2$.

Further, in the semiconductor device of FIG. 1A, after the epitaxial growth step and the field oxidation step, the P-buried layer $P_1$ is formed by the ion implantation method using high-energy boron ions. Hence, the upward diffusion of boron from the buried layer $P_1$ into the epitaxially grown layer 32 is only a little. Accordingly, a thin epitaxially-grown layer can be used which is necessary for forming a bipolar transistor capable of performing a high-speed operation.

Figure 4:
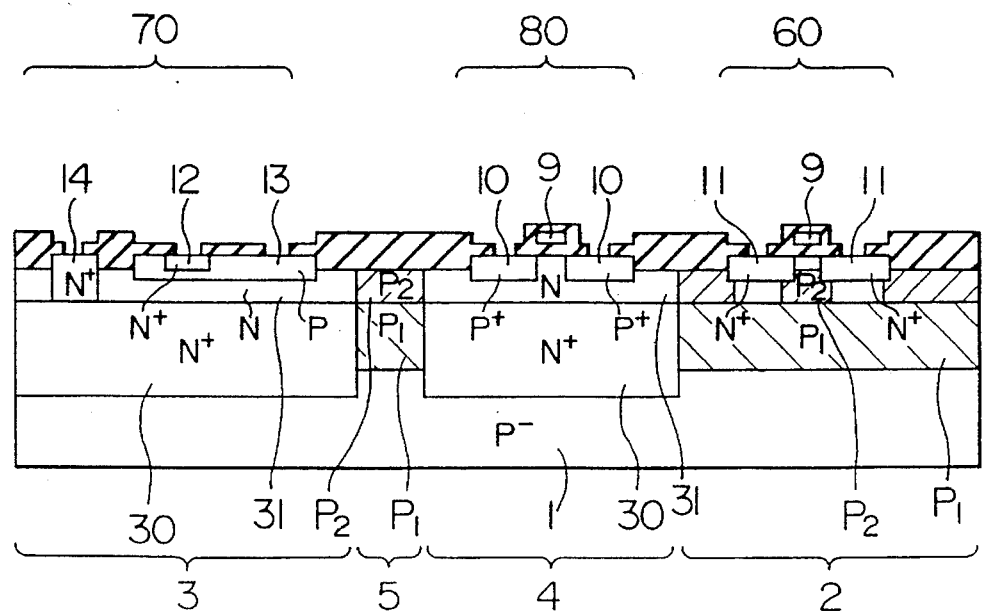
FIG. 4 is a sectional view showing another embodiment of a semiconductor device according to the present invention.

It is to be noted that the above discussion also holds for another inventive semiconductor device shown in FIG. 4.

FIG. 4 shows another embodiment of a semiconductor device according to the present invention, in which embodiment the buried layer $P_2$ is formed only in the channel region existing under the gate electrode 8 of the N-channel MOS transistor. That is, the embodiment of FIG. 4 is different from the embodiment of FIG. 1A in that the buried layer $P_2$ is formed in the channel region of the N-channel MOS transistor but is not formed under the source and drain regions thereof, or the buried layer $P_2$ is formed in the above channel region and under a portion of each of the above source and drain regions. A semiconductor layer which is smaller in impurity concentration than the buried layer $P_2$, is provided in regions which lie under the source and drain regions of the N-channel MOS transistor, and where the buried layer $P_2$ does not exist. For example, the P-diffusion layer 21 is used as the above semiconductor layer. Thus, the impurity concentration of a P-type layer kept in contact with the bottom of each of the source and drain regions of the N-channel MOS transistor is far smaller than the impurity concentration of the buried layer $P_2$. Accordingly, the junction capacity at the source and drain regions is remarkably reduced, and thus the N-channel MOS transistor can perform a high-speed operation. In FIG. 4, the same reference numerals as in FIG. 1A designate identical or equivalent parts.

As has been explained in the foregoing, according to the present invention, the P-buried layer $P_2$ for preventing the punch through of the N-channel MOS transistor can be formed without increasing the impurity concentration of the P-buried layer $P_1$ which is kept in contact with the $N^+$-buried layer 30 acting as the collector of the bipolar transistor. Accordingly, an integrated circuit can be formed by a very fine MOS transistor having a gate length less than or equal to 0.5 µm and a bipolar transistor, without deteriorating the high-speed characteristic of the bipolar transistor.

We claim:

1. A method of fabricating a semiconductor device, comprising the steps of:

diffusing an impurity into a semiconductor substrate of a first conductive type from a surface of the semiconductor substrate so that a plurality of discrete buried semiconductor layers of a second conductive type are formed in the semiconductor substrate;

forming a lightly-doped semiconductor layer on that surface of the semiconductor substrate where the buried semiconductor layers of the second conductive type are formed, by epitaxial growth;

implanting an impurity of the second conductive type in portions of the lightly-doped semiconductor layer which exist on the buried semiconductor layers, and implanting an impurity of the first conductive type in a portion of the lightly-doped semiconductor layer, under which the buried semiconductor layers are absent;

carrying out heat treatment to convert the portions implanted with the impurity of the second conductive type to form diffusion layers of the second conductive type, and to convert the portion implanted with the impurity of the first conductive type to form a diffusion layer of the first conductive type;

forming a selective protection film on an exposed surface;

implanting an impurity of the first conductive type in a portion of the semiconductor substrate which exists under the diffusion layer of the first conductive type, through the selective protection film to form a first buried layer of the first conductive type;

implanting an impurity of the first conductive type in the diffusion layer of the first conductive type through the selective protection film by ion implantation, to form a second buried layer of the first conductive type;

forming a base layer and an emitter layer on one of the buried semiconductor layers of the second conductive type to form a bipolar transistor;

forming a gate oxide film, a gate electrode, a source region and a drain region on another one of the buried semiconductor layers of the second conductive type to form a MOS transistor having a channel of the first conductive type; and forming a gate oxide film and a gate electrode on the second buried layer of the first conductive type and forming source and drain regions in the second buried layer of the first conductive type, to form a MOS transistor having a channel of the second conductive type.

2. A method of fabricating a semiconductor device as claimed in claim 1, wherein the selective protection film is formed by carrying out heat treatment in an oxidizing atmosphere.

3. A method of manufacturing a semiconductor integrated circuit device comprising the steps of:

a) forming a first semiconductor region of a first conductivity type in a first region of a main surface of a semiconductor substrate, and forming a second semiconductor region of said first conductivity type in a second region of said main surface of said substrate, said first and second regions being different from each other;

b) forming a third semiconductor region of a second conductivity type, which is opposite to said first conductivity type, in a third region of said main surface of said substrate between said first and second regions, and forming a fourth semiconductor region of said second conductivity type in a fourth region of said main surface of said substrate, said third semiconductor region being in contact with said first and second semiconductor regions, and said fourth and second regions being adjacent to each other;

c) forming a field insulating film on a surface of said third semiconductor region;

d) after the step c), introducing first impurities of said second conductivity type into said third semiconductor region through said field insulating film and introducing said first impurities into said fourth semiconductor region so as to simultaneously form a fifth semiconductor region of said second conductivity type under said field insulating film and a sixth semiconductor region of said second conductivity type in said fourth semiconductor region, said fifth semiconductor region having an impurity concentration higher than that of said third semiconductor region, and said sixth semiconductor region having an impurity concentration higher than that of said fourth semiconductor region and being formed at a predetermined depth from an upper surface of said fourth semiconductor region; and e) forming a first MISFET having a channel of said first conductivity type in said upper surface of said fourth semiconductor region on said sixth semiconductor region, forming a second MISFET having a channel of said second conductivity type in a surface of said second semiconductor region, and forming a bipolar transistor in said first semiconductor region.

4. A method of manufacturing a semiconductor integrated circuit device according to claim 3, wherein said sixth semiconductor region is a punch-through stopper of source and drain regions of said first MISFET.

5. A method of manufacturing a semiconductor integrated circuit device according to claim 4, wherein said first and second semiconductor regions are electrically isolated from each other by said fifth semiconductor region, said third semiconductor region and said field insulating film.

6. A method of manufacturing a semiconductor integrated circuit device according to claim 5, wherein the step of forming said first semiconductor region includes a step of forming a buried type semiconductor region of said first conductivity type in said semiconductor substrate and a step of forming a first well of said first conductivity type in said semiconductor substrate on said buried type semiconductor region, and wherein said buried type semiconductor region has an impurity concentration higher than that of said first well.

7. A method of manufacturing a semiconductor integrated circuit device according to claim 6, wherein said buried type semiconductor region and said first well are collector of said bipolar transistor.

8. A method of manufacturing a semiconductor integrated circuit device according to claim 3, wherein the step of forming said first MISFET includes a step of forming a gate electrode over the upper surface of said fourth semiconductor region with a gate insulating film interposed between the gate electrode and the upper surface of the fourth semiconductor region, and a step of forming source and drain regions in said fourth semiconductor region adjacent to edges of said gate electrode, and wherein said sixth semiconductor region is formed under a channel region between said source and drain regions of said first MISFET.

9. A method of fabricating a semiconductor device as claimed in claim 1, wherein the second buried layer of the first conductive type is not formed beneath at least a part of the source region and the drain region of the MOS transistor having a channel of the second conductive type.

10. A method of fabricating a semiconductor device as claimed in claim 1, wherein the second buried layer of the first conductive type is not formed beneath the source region and the drain region of the MOS transistor having a channel of the second conductive type.

* * * * *